United States Patent
Lee et al.

(10) Patent No.: US 6,719,918 B2
(45) Date of Patent: Apr. 13, 2004

(54) METHOD OF REDUCING NOTCHING DURING REACTIVE ION ETCHING

(75) Inventors: Byeung-leul Lee, Kyungki-do (KR); Taek-ryong Chung, Kyungki-do (KR); Joon-hyock Choi, Kyungki-do (KR); Won-youl Choi, Kyungki-do (KR); Kyu-dong Jung, Kyungki-do (KR); Sang-woo Lee, Seoul (KR)

(73) Assignee: Samsung Electronics Co., Ltd. (KR)

( * ) Notice: Subject to any disclaimer, the term of this patent is extended or adjusted under 35 U.S.C. 154(b) by 86 days.

(21) Appl. No.: 10/025,798

(22) Filed: Dec. 26, 2001

(65) Prior Publication Data

US 2002/0125211 A1 Sep. 12, 2002

(30) Foreign Application Priority Data

Mar. 12, 2001 (KR) .......................... 2001-12629

(51) Int. Cl.⁷ .......................................... H01L 21/3065
(52) U.S. Cl. .............................. 216/79; 216/39; 216/40; 438/706; 438/719; 438/723
(58) Field of Search ............................. 216/39, 40, 79; 438/706, 719, 723

(56) References Cited

U.S. PATENT DOCUMENTS

| 6,071,822 | A | * | 6/2000 | Donohue et al. | ............ | 438/712 |
| 6,180,486 | B1 | * | 1/2001 | Leobandung et al. | ........ | 438/405 |
| 6,187,685 | B1 | * | 2/2001 | Hopkins et al. | ............ | 438/710 |
| 6,245,635 | B1 | * | 6/2001 | Lee | .............................. | 438/407 |
| 6,261,966 | B1 | * | 7/2001 | Li et al. | ...................... | 438/706 |

\* cited by examiner

Primary Examiner—Robert Kunemund
Assistant Examiner—Shamim Ahmed
(74) Attorney, Agent, or Firm—Burns Doane Swecker & Mathis, LLP

(57) ABSTRACT

A method of reducing notching during reactive ion etching (RIE) is provided. The method is useful when RIE is performed to pass through a silicon layer on a multi-layered structure on which the silicon layer, an insulating layer and a silicon substrate are sequentially deposited. The method includes the steps of: forming an insulating layer on a silicon substrate; forming trenches on the insulating layer to expose the silicon substrate; forming a silicon layer on the insulating layer to fill the trenches; and patterning the silicon layer to form first etch regions, which pass through the silicon layer, to include the trenches. According to the method, it is possible to remarkably reduce notching without depositing a metal layer, when a multi-layered structure including a silicon layer which is etched to be passed through during RIE is fabricated.

6 Claims, 7 Drawing Sheets

METHOD OF REDUCING NOTCHING DURING REACTIVE ION ETCHING

Priority is claimed to U.S. patent application Ser. No. 2001-12629, filed in the Republic of Korea on Mar. 12, 2001, herein incorporated by reference.

BACKGROUND OF THE INVENTION

1. Field of the Invention

The present invention relates to a method of reducing notching during reactive ion etching (RIE), and more particularly, to a method of reducing notching in a lower portion of a silicon layer when RIE is performed to pass through the silicon layer on a sequentially-stacked structure of the silicon layer, an insulating layer and a silicon substrate.

2. Description of the Related Art

A reactive ion etching (RIE) method has been generally used to pattern a silicon structure. However, when RIE is performed to pass through a silicon layer on a multi-layered structure of the silicon layer, an insulating layer and a silicon substrate, the silicon layer is prone to be overetched due to a microloading effect. For instance, as shown in FIG. 1, a region having a large aperture 36 in which the etching rate is fast is overetched while a region having a small aperture 34 in which the etching rate is slow is etched to be passed through. As a result, the surface of an insulating layer 20 is charged with electricity by an etching ion which reacts to form an electric potential on the insulating layer 20. Due to the electric potential, the etching ion is reflected from the insulating layer 20, which causes unnecessary lateral etching in a lower portion of a silicon layer 30. The lateral etching, i.e., notching 32, makes a structure thinner and further, the surface of the structure irregular, thereby deteriorating the mechanical and electrical characteristics.

To prevent such notching, there was an attempt to form a metal layer on an insulating layer so that an etching ion can be discharged therefrom. However, this method is inconvenient because it requires additional deposition of a metal layer and anodic bonding.

SUMMERY OF THE INVENTION

To solve the above problem, it is an object of the present invention to provide a method of remarkably reducing notching occurring in a lower portion of a silicon layer when RIE is performed to pass through the silicon layer on a sequentially-stacked structure of the silicon layer, an insulating layer and a silicon substrate.

To accomplish the above object, there is provided a method of reducing notching occurring when RIE is performed to pass through a silicon layer in a multi-layered structure in which the silicon layer, an insulating layer and a silicon substrate are sequentially deposited according to the present invention. The method includes the steps of: (a) forming an insulating layer on a silicon substrate; (b) forming trenches on the insulating layer to expose the silicon substrate; (c) forming a silicon layer on the insulating layer to fill the trenches; and (d) patterning the silicon layer to form first etch regions, which pass through the silicon layer, to include the trenches.

It is preferable that in step (d) the silicon layer between the trenches is patterned to form second etch regions which are narrower than the first etch regions.

Also, it is preferable that in step (d) silicon filled in the trenches is removed to expose the silicon substrate.

BRIEF DESCRIPTION OF THE DRAWINGS

The above objects and advantages of the present invention will become apparent by describing in detail a preferred embodiment thereof with reference to the attached drawings in which.

DETAILED DESCRIPTION OF THE INVENTION

Figure 1:
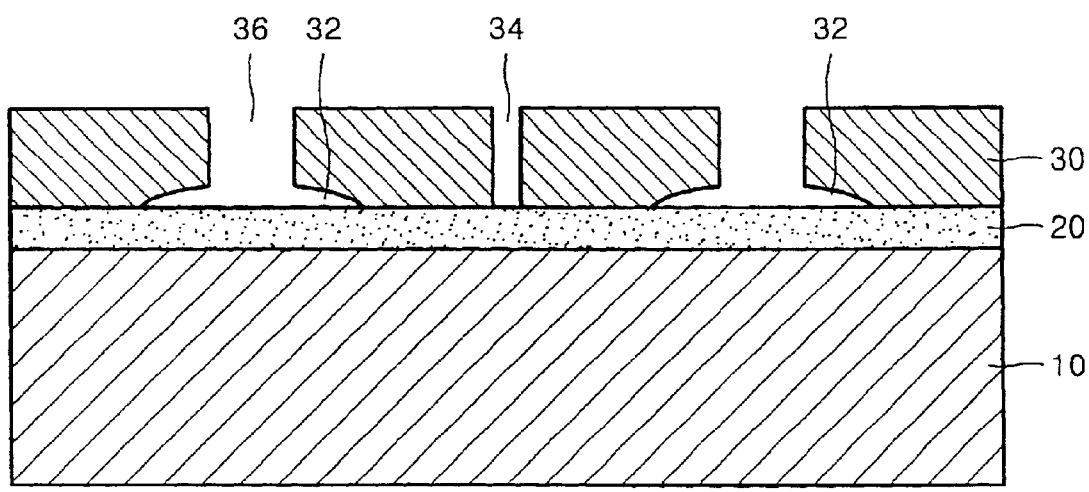
FIG. 1 is a cross-sectional view of structure in which notching occurs according to conventional reactive-ion etching (RIE)
Figure 2:
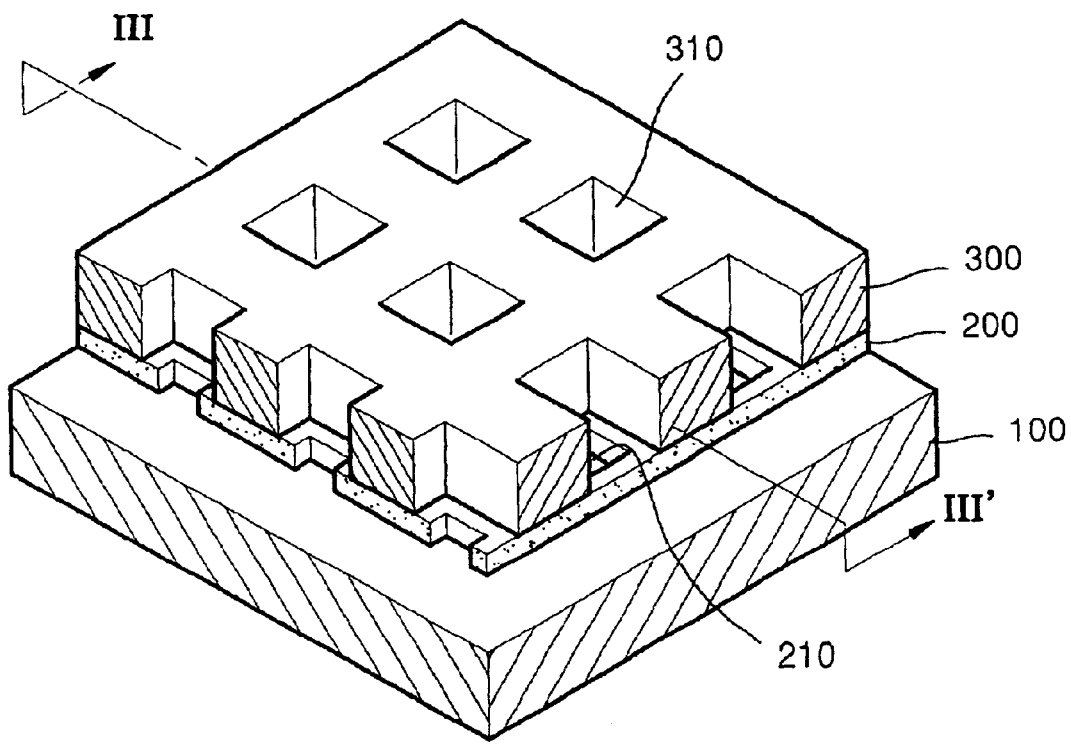
FIG. 2 is a perspective view of a structure according to a preferred embodiment of the present invention.
Figure 3:
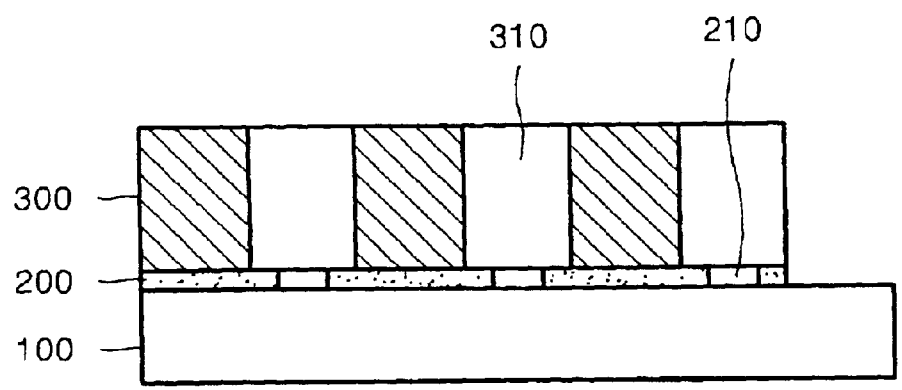
FIG. 3 is a cross-sectional view of the structure of FIG. 2, taken along the line III–III'.

FIG. 2 shows a perspective view of a multi-layered structure of a silicon layer, an insulating layer and a silicon substrate according to the present invention. FIG. 3 is a cross-sectional view of the multi-layered structure shown in FIG. 2, taken along the lines III–III'.

Referring to FIGS. 2 and 3, an insulating layer 200 having trenches 210 is formed on a silicon substrate 100 and a silicon layer 300 is formed on the insulating layer 200. The trenches 210 on the insulating layer 200 are positioned in respective etch regions 310 on the silicon layer 300.

FIGS. 4A through 4E are cross-sectional views for explaining a method of reducing notching occurring during RIE according to the present invention.

Figure 4A:
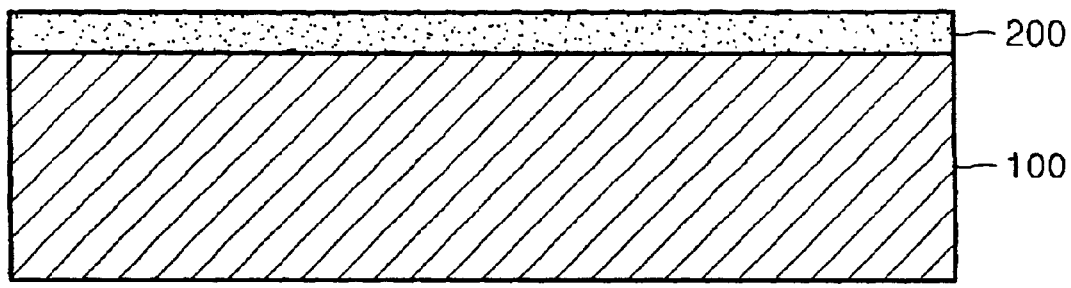
FIGS. 4A through 4E are cross-sectional views for explaining a method of reducing notching occurring during RIE according to a preferred embodiment of the present invention.
Figure 4B:
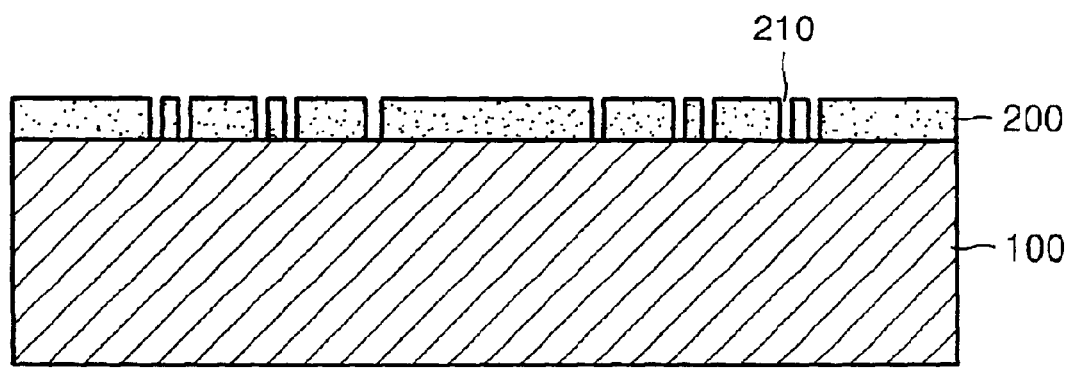
Figure 4C:
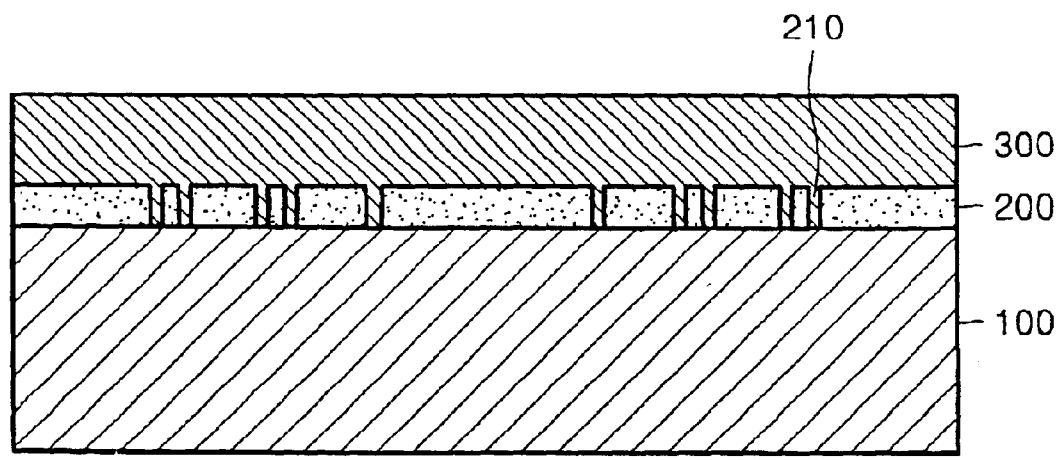
Figure 4D:
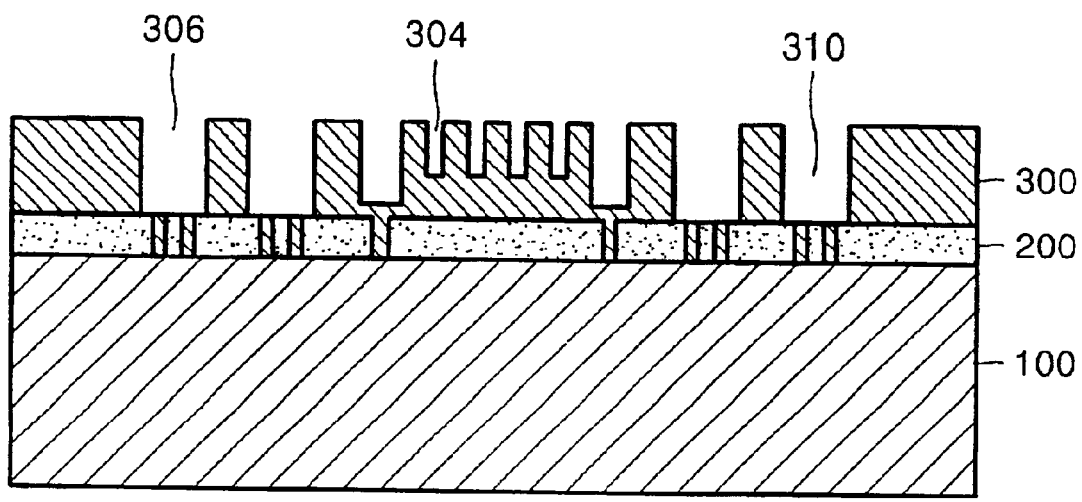

Referring to FIG. 4A, an insulating layer 200 is formed to a predetermined thickness on a silicon substrate 100. Next, the insulating layer 200 is patterned to form trenches 210 to pass through the insulating layer 200 as shown in FIG. 4B. As a result, the surface of the silicon substrate 100 placed below the trenches 210 is exposed. Then, as shown in FIG. 4C, a silicon layer 300 is formed on the insulating layer 200 to fill the trenches 210. Thereafter, RIE is performed on the silicon layer 300 (refer to FIG. 4D).

At this time, the etching rate in a region 306 having a large aperture is faster than that in a region 304 having a small aperture. Therefore, during RIE, the entire silicon layer 300 in the region 306 is etched to expose the surface of the insulating layer 200, whereas only a portion of the silicon layer 300 in the region 304 is etched.

Figure 4E:
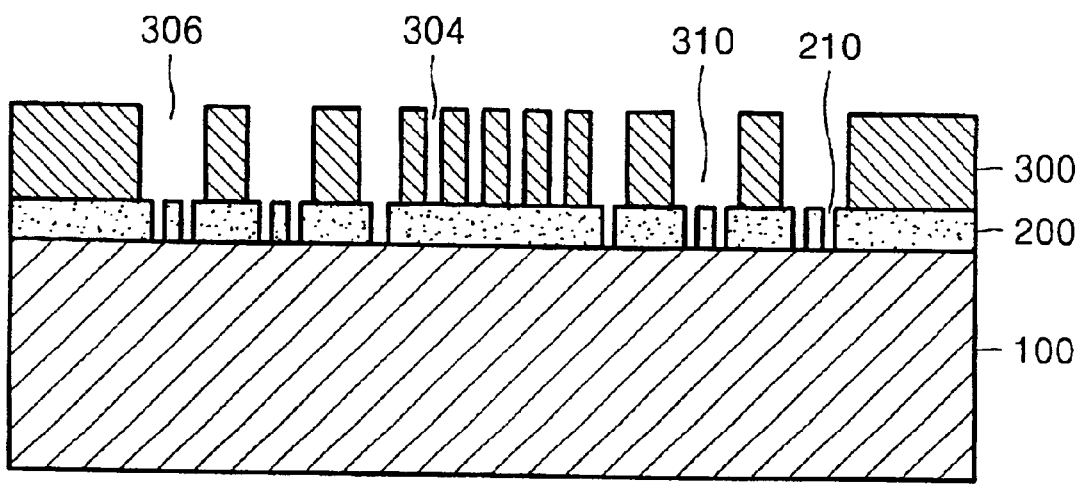

Accordingly, if RIE is continued to etch the entire silicon layer 300 in the region 304, the silicon layer 300 filled in the trench 210 on the insulating layer 200, which is positioned below the large aperture 306, is etched to expose the silicon substrate 100 as shown in FIG. 4E. At this time, etching ions are generated due to overetching in the region 306 and are discharged via the silicon substrate 100. Meanwhile, it is possible to omit a process of forming the trenches 210 on the insulating layer 200 below the region 304 having a small aperture when the regions 306 and 304 are etched together by RIE.

EXPERIMENTAL EXAMPLE

Figure 5:
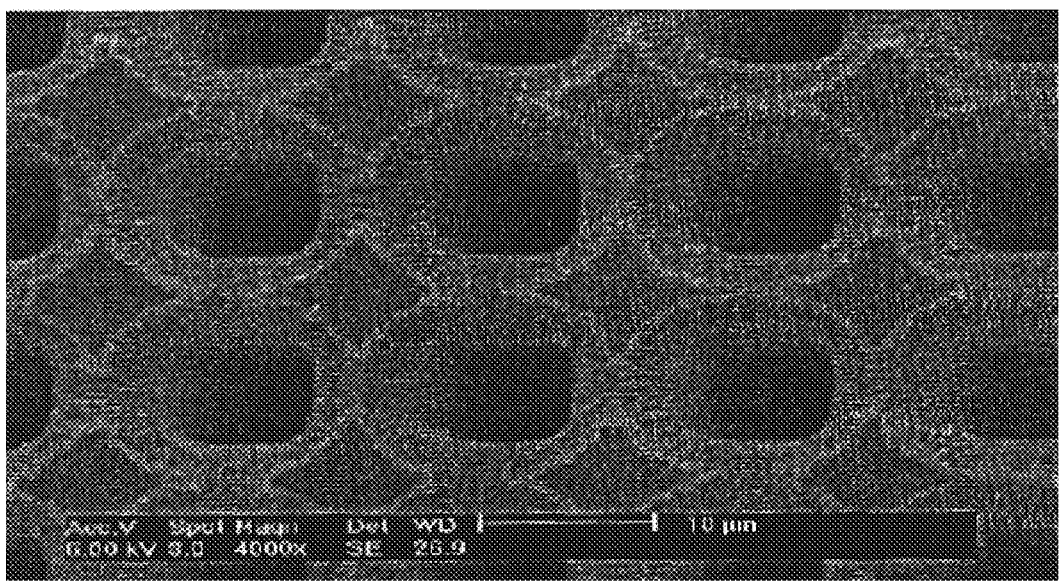
FIG. 5 is a photograph of a lower portion of a silicon layer after RIE is performed to pass through the silicon layer according to a conventional method, taken by a scanning electron microscope (SEM)
Figure 5:
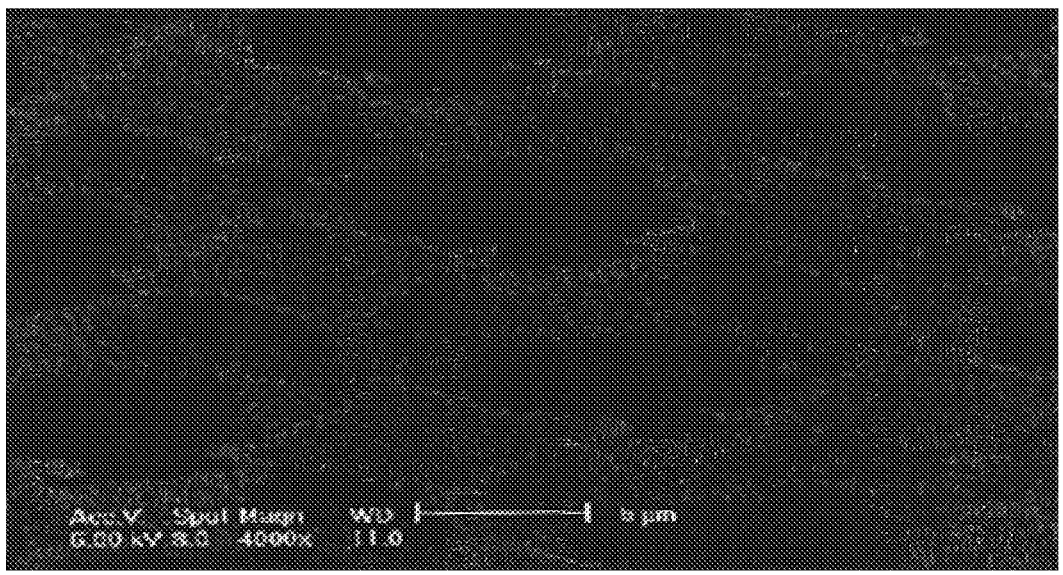
Figure 6:
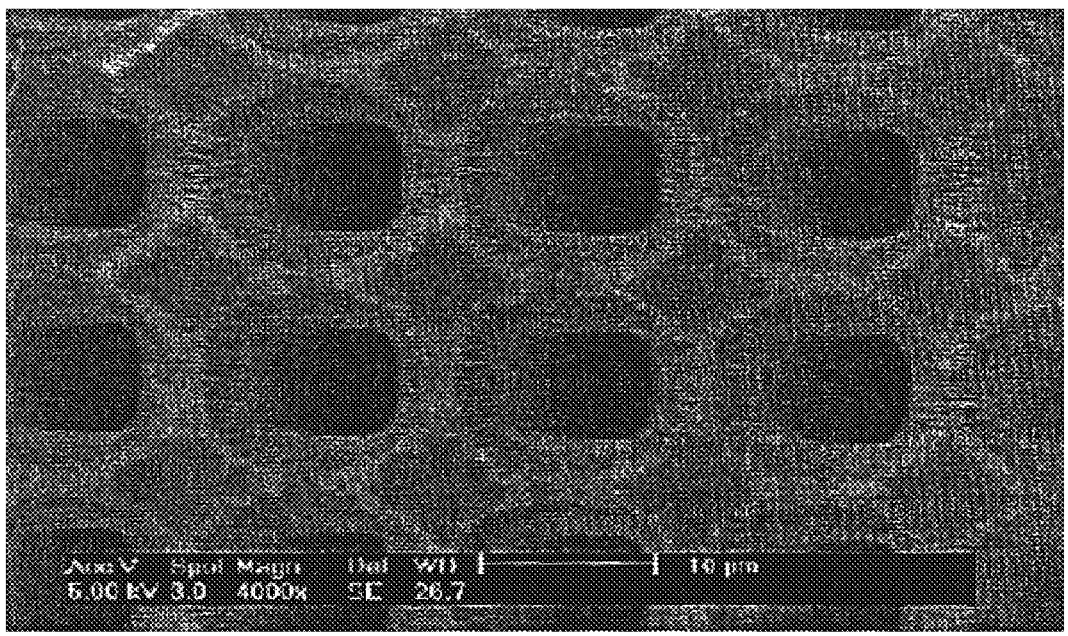
FIG. 6 is a SEM photograph of a lower portion of a silicon layer formed on an insulating layer having 3 $\mu$m-wide trenches after RIE is performed to pass through the silicon layer.
Figure 6:
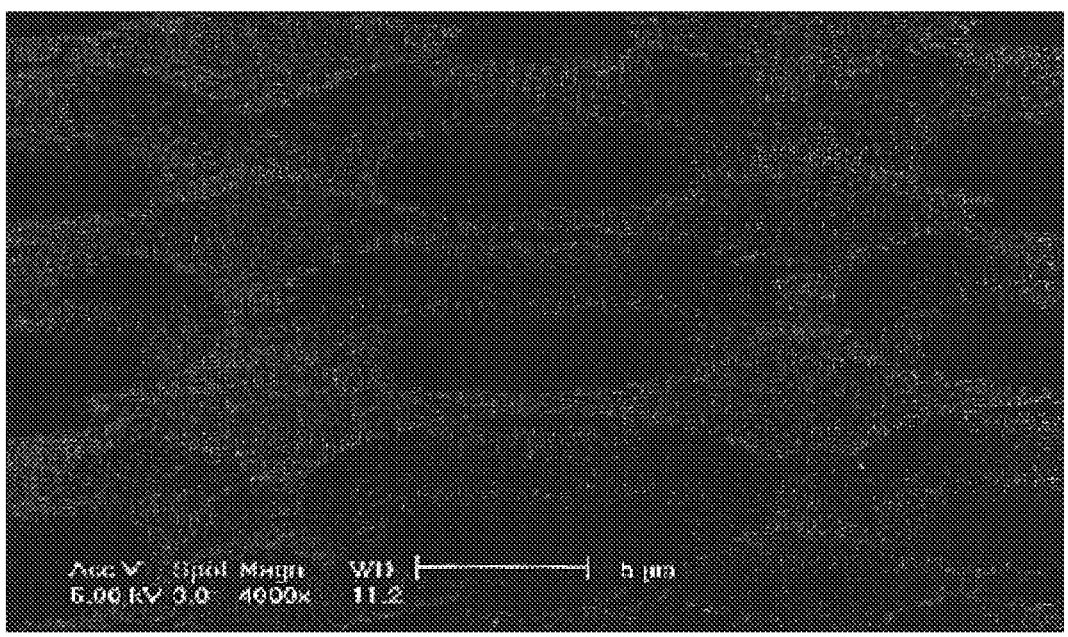
Figure 7:
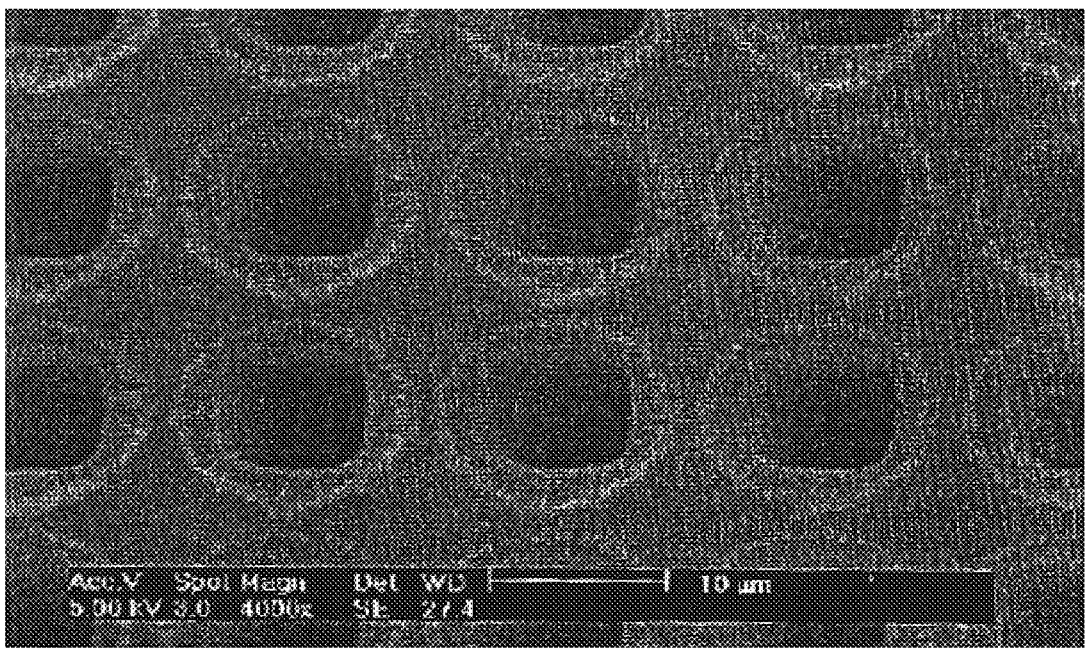
FIG. 7 is a SEM photograph of a lower portion of a silicon layer formed on an insulating layer having 6 $\mu$m-wide trenches after RIE is performed to pass through the silicon layer.
Figure 7:
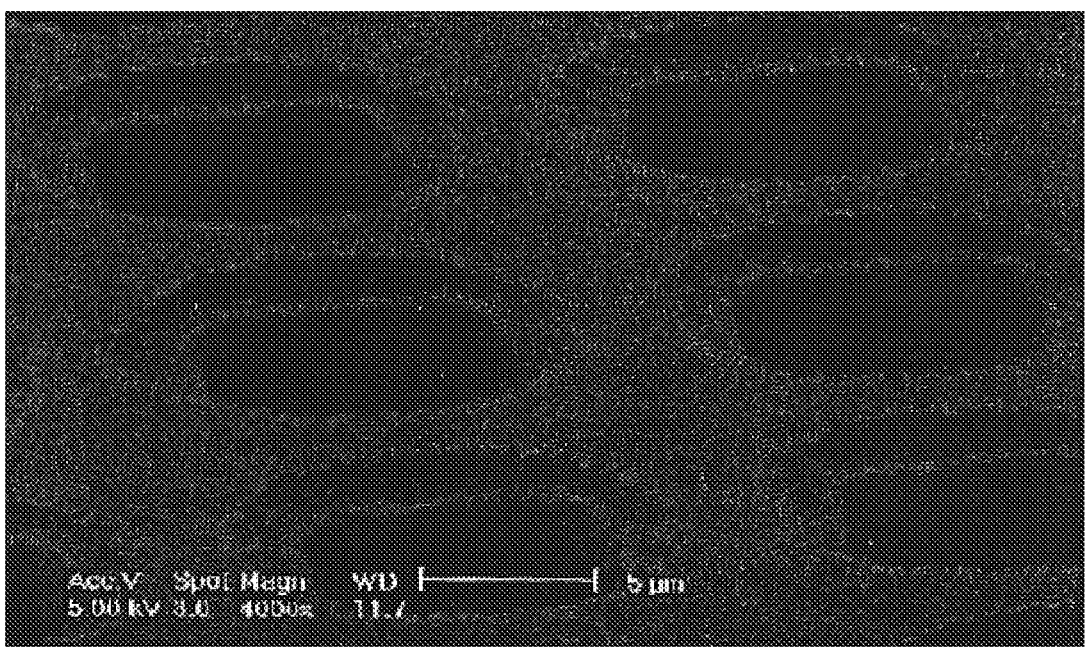

FIG. 5 is a scanning electron microscope (SEM) photograph of a lower portion of a conventional silicon layer, which is formed on an insulating layer having no trenches and etched to be passed through by RIE. FIG. 6 is an SEM photograph of a lower portion of a silicon layer, which is formed on an insulating layer having 3 μm-wide trenches and etched to be passed through by RIE. FIG. 7 is an SEM photograph of a lower portion of a silicon layer, which is formed on an insulating layer having 6 μm-wide trenches and etched to be passed through by RIE.

In the experimental example, a silicon layer structure having a thickness of 52 μm formed on a tetra ethylorthosilicate (TEOS) insulating layer having a thickness of 2.5 μm, was used. Firstly, silicon layers were formed on an insulating layer having no trenches, an insulating layer having 3 μm-wide trenches and an insulating layer having 6 μm-wide trenches, respectively. Then, when RIE was performed on the silicon layer to form an aperture of about 8 μm thereon, the silicon layer was deliberately about 30% overetched to cause notching and the results are as shown in the SEM photographs in FIGS. 5 through 7.

Referring to FIG. 5, excessive notching occurred on the bottom of the silicon layer having no trenches due to the overetching. Referring to FIG. 6, a little notching occurred in a silicon layer on an insulating layer having 3 μm-wide trenches. However, from FIG. 7, it can be seen that notching was remarkably reduced in a silicon layer on an insulating layer having 6 μm-wide trenches. Usually, notching occurs in a lower portion of a wall of a silicon layer. Therefore, it seems that notching can be prevented by discharging etching ions near the lower portions of the walls, and further, the narrower a gap between the walls and the trenches is, the less the notching is.

As described above, in a method according to the present invention, it is possible to satisfactorily reduce notching without additional deposition of a metal layer, when fabricating a multi-layered structure having a silicon layer which is etched to be passed through by RIE. Therefore, the method is very helpful in manufacturing a device requiring RIE.

While the present invention has been particularly shown and described with reference to the preferred embodiment thereof, it will be understood by those skilled in the art that various changes in form and details may be made without departing from the spirit and scope of the invention as defined by the appended claims.

What is claimed is:

1. A reactive ion etching (RIE) method performed to pass through a silicon layer on a sequentially-stacked structure of the silicon layer, an insulating layer and a silicon substrate, the method comprising the steps of:
   (a) forming an insulating layer on a silicon substrate;
   (b) forming trenches in the insulating layer to expose the silicon substrate;
   (c) forming a silicon layer on the insulating layer to fill the trenches; and
   (d) patterning using RIE the silicon layer to form first etch regions, which pass through the silicon layer, to include the trenches and thereby exposing the silicon substrate.

2. The RIE method of claim 1, wherein step (d) comprises patterning the silicon layer positioned between trenches to form second etch regions which are narrower than the first etch regions.

3. The RIE method of claim 1, wherein step (d) comprises removing silicon filled in the trenches to expose the silicon substrate.

4. A reactive ion etching (RIE) method performed to pass through a silicon layer on a sequentially-stacked structure of the silicon layer, an insulating layer and a silicon substrate, the method comprising the steps of:
   (a) forming an insulating layer on a silicon substrate;
   (b) forming trenches in the insulating layer to expose a top surface of the silicon substrate;
   (c) forming a silicon layer on the insulating layer to fill the trenches; and
   (d) patterning using RIE the silicon layer to form first etch regions, which pass through the silicon layer, to include the trenches and thereby exposing the silicon substrate.

5. The RIE method of claim 4, wherein step (d) comprises patterning the silicon layer positioned between trenches to form second etch regions which are narrower than the first etch regions.

6. The RIE method of claim 4, wherein step (d) comprises removing silicon filled in the trenches to expose the silicon substrate.

* * * * *